United States Patent [19]

Monforte

[11] Patent Number: 4,809,425

[45] Date of Patent: Mar. 7, 1989

[54] ADAPTABLE, PROGRAMMABLE PRODUCTION SYSTEM

[75] Inventor: Mathew L. Monforte, Hamilton, N.J.

[73] Assignee: Monforte Robotics, Inc., West Trenton, N.J.

[21] Appl. No.: 198,288

[22] Filed: May 25, 1988

Related U.S. Application Data

[63] Continuation-in-part of Ser. No. 577,570, Feb. 6, 1984, abandoned, which is a continuation-in-part of Ser. No. 892,798, Aug. 4, 1986, abandoned.

[51] Int. Cl.[4] .............................................. B23Q 3/155
[52] U.S. Cl. ...................................... 29/568; 29/563; 29/264; 101/37
[58] Field of Search ..................... 29/264, 33 P, 568; 408/35; 414/736, 749, 753; 219/86.7, 86.8, 125.1; 901/7, 16, 37, 42, 46, 47

[56] References Cited

U.S. PATENT DOCUMENTS 3,722,711  3/1973  Seidel ............................... 29/568 X
4,398,138  8/1983  Tanaka .............................. 29/568 X
4,486,928  12/1984  Tucker et al. ...................... 29/264

FOREIGN PATENT DOCUMENTS 0045174  2/1982  European Pat. Off. .............. 901/47
2041262  9/1980  United Kingdom .................. 901/37

Primary Examiner—Z. R. Bilinsky
Attorney, Agent, or Firm—Sachs & Sachs

[57] ABSTRACT

An adaptable, programmable production system for manufacturing articles in which a plurality of operations are required includes an electronically programmable robot having a controllable arm with an end effector disposed thereon. The robot is placed proximate a surface, preferably movable, to be used for the assembly of the articles. A passive, non-interactive storage tray is provided proximate the robot and within range of the extended robot arms. The end effector disposed on the distal end of the robot arm may be programmed to remove and replace a particular tool, component or any of the implement or component from the storage trays, bins or from a moving conveyor when within range and may be utilized to perform a plurality of functions, such as inserting components into the article being manufactured, or performing multiple operations thereon by exchanging tools.

6 Claims, 5 Drawing Sheets

ADAPTABLE, PROGRAMMABLE PRODUCTION SYSTEM

The present application is a continuation-in-part of application Ser. No. 892,798 filed Aug. 4, 1986, now abandoned, which was a continuation-in-part of application Ser. No. 577,570 filed Feb. 6, 1984 now abandoned.

BACKGROUND OF THE INVENTION

1. Field of the Invention

The present invention relates to automatic production lines, and in particular, to an adaptable, programmable production system utilizing a robot arm having an end effector capable of changing end effector tools associated therewith, as required, in order to perform a plurality of functions.

2. Discussion of the Relevant Art

Numerous types of automatic production machinery and systems are known in the art. Each of these systems require a plurality of automatic or robotic mechanisms to perform an individual function and generally each mechanism performs just one single operation. Items being assembled are disposed proximate the robot mechanism and move along on a moving belt or platform. The robot is fitted with a particular tool or instrument and performs one particular operation. Other robots may be used to place a component on the item being manufactured prior to reaching a second robot which performs a specified operation thereon. This is repeated numerous times until at the end of the moving platform the assembled article is removed and stored. If a misassembly occurs or a component is not in the position in which it is required to be at the time the robotic arm is to engage it, a breakdown occurs. Generally, audible signals are provided for a human to correct the default or breakdown condition so that the production line can be restarted.

If the robot is to perform more than one function, a human is required to change the tool used on the robotic arm and in some cases the human must change the complete robot. Of course, the programming for the robot is modified each time a different operation is required for that particular robot. In some of the more sophisticated types of equipment the robot is capable of more than one operation, although a similar type of implement must be utilized. For example, a turret drill head may be provided with several different drill sizes. The robot may be programmed to drill a particular hole in an article being manufactured using a particular drill size. A second drilling operation may be provided with the turret rotated to a second position in which a different drill size is provided.

In other types of automated equipment the new tool or fixture is moved by a moving belt or platform into position proximate the robotic arm and a second robotic arm removes the tool from the platform or storage bin and inserts it into the robot that is to do the operation on the article being manufactured, at the same time removing the tool in position from an earlier operation.

Typical of these automatic machines is the disclosure in U.S. Pat. No. 4,398,136 issued to H. Tanaka on Aug. 9, 1983. The apparatus therein provides for automatic tool changing with a visual or audible indication when the tool changing has not occurred after several tries. The mechanism disclosed therein provides for an additional robotic arm which selects the tool from a tool holder, replacing an old tool and moving the new tool into position, where it is accepted by the main robotic device in order to perform the necessary operation. The moving arm used to select the tool does not perform the selected operation on the work piece.

In another disclosure found in U.S. Pat. No. 3,722,711 issued to W. B. Seidel on Mar. 27, 1973, a pair of arms is utilized to transfer tools between a tool storage tray and a spindle. The spindle is limited in performing operations which may only be accomplished by the limited capabilities of the machine, such as performing a milling or drilling operation.

An automatic insertion mechanism is disclosed in U.S. Pat. No. 4,486,928 issued to Tucker, et al on Dec. 11, 1984. The mechanism disclosed therein provides for the exchange of a plurality of tools, which are releasably retained in their respective storage locations, released just prior to their transport to the work station, and are retentively held at their respective storage locations after return thereto. The mechanism is utilized to insert a plurality of components into a printed circuit board.

Applicant is not aware of any other type of machine that can perform multiple functions, such as, selecting components for insertion in an article to be manufactured, drilling holes, inserting screws, applying adhesive to selected areas on the article, etc., etc., all accomplished with a single robotic arm having a gripper mechanism in the end effector on the robotic arm, which may be programmed to exchange a plurality of end effector tools to provide a plurality of operational functions to be performed.

The system disclosed in the instant invention overcomes the shortcomings found in the prior art by providing an adaptable, programmable production system wherein a single robot with a robotic arm having an end effector with interchangeable tools may perform numerous functions including insertion of components into the article being manufactured, as well as, performing operations on the same article. The tool storage bin or receptacle is passive and non-interactive with the end effector, solely providing a predetermined location for individual tools.

Therefore, it is an object of the present invention to provide a robot having a robotic arm with an end effector on the distal end thereof wherein the end effector has a readily replaceable tool disposed thereon, which is compatible with the function to be performed.

Another object of the present invention is to provide a robot capable of performing a plurality of operations and functions on an article being manufactured.

Still another object of the present invention is to provide an adaptable, programmable production system utilizing a single robot capable of batch production of articles.

Yet another object of the present invention is to provide a robot capable of replacing a plurality of single function robots.

Still yet another object of the present invention is to provide an economical automatic programmable production system capable of correcting its own malfunctions without requiring human intervention.

Still yet another object of the present invention is to provide an automatic production system having the capability of assembling a product from start to finish wherein components are assembled automatically and operations are performed thereon so that the completed article may be removed from the production line and placed into a final shipping package.

SUMMARY OF THE INVENTION

An adaptable, programmable production system, for manufacturing articles requiring a plurality of operations, according to the principles of the present invention comprises, in combination; an electronically programmable robot having one controllable arm. The robot is disposed proximate a surface utilized for the assembly of articles being manufactured, and is provided with an end effector on the distal end of the robotic arm. The end effector has a removably retained tool mechanism which is automatically exchangeable by the end effector's gripper fingers in response to a prescribed program coupled to the robot. Each of the exchangeable tool mechanisms is adapted to perform a function or to receive and cooperate with components, which are of different sizes and shapes. These tools or components are passively and non-interactively stored in a prescribed location, such as a tray, disposed proximate the robot and within the reach of the robotic arm. The arm is capable of moving the end effector to the passive or non-interactive storage area and selecting an end effector tool and then a component and installing it into the article being manufactured. The end effector is also capable of selecting a tool for performing a preprogrammed operation on the article. A programming computer coupled to the robot supplies the programmed information to the robot to have it perform the prescribed functions.

A method of providing an adaptable, programmable production system for manufacturing articles requiring a plurality of operations, according to the principles of the present invention, comprises the steps of: providing an electronically programmable robot having one controllable arm with an end effector having a gripper mechanism disposed on the distal end thereof; providing a surface proximate the robot for the assembly of an article to be manufactured; providing a passive storage tray having a plurality of tools and a plurality of components to be installed into the article; programming the robot arm to cause the end effector gripper mechanism to select a tool that is adapted to cooperate with a component from the passive and non-interactive storage tray; moving the end effector tool to obtain a component and place it on the article being manufactured; moving the tool to the storage tray for exchanging the tool for another tool; moving the other tool to select and retain a component; moving the component to the article being manufactured; obtaining yet another tool from this storage tray; operating the new tool to perform a prescribed function; returning the new tool to the storage tray; obtaining another tool for gripping the finished article; and removing the finished article from the assembly surface to a new location.

The foregoing and other objects and advantages will appear from the description to follow. In the description reference is made to the accompanying drawing which forms a part hereof, and which is shown by way of illustration a specific embodiment in which the invention may be practiced. The embodiment will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWING

In order that the invention may be more fully understood, it will now be described by way of example, with reference to the accompanying drawing, wherein like reference characters refer to like elements and in which.

DESCRIPTION OF THE PREFERRED EMBODIMENT

Figure 1:
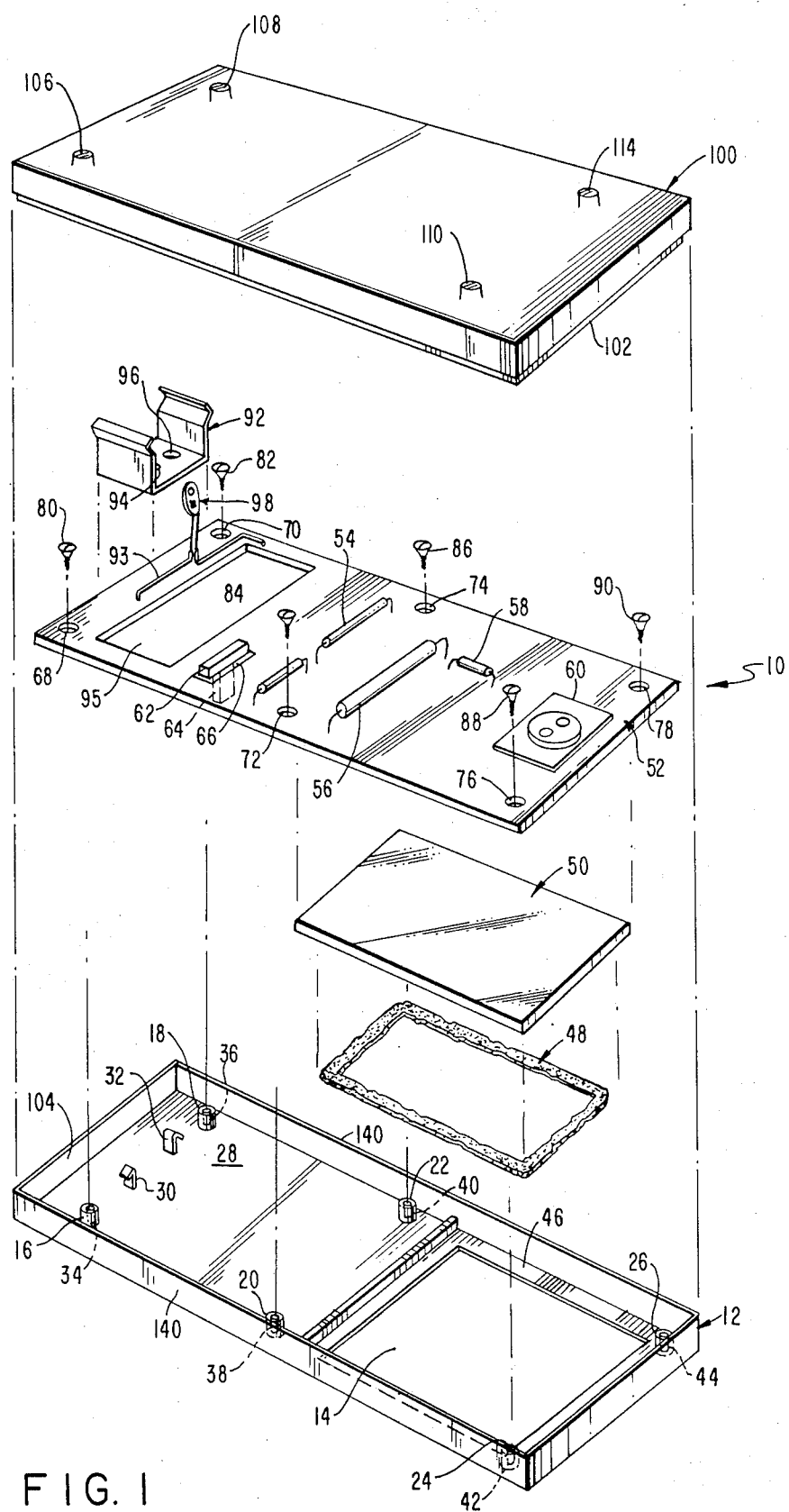
FIG. 1 is an exploded, pictorial representation in perspective of a typical article to be assembled on an adaptable, programmable production system, according to the principles of the present invention.
Figure 2:
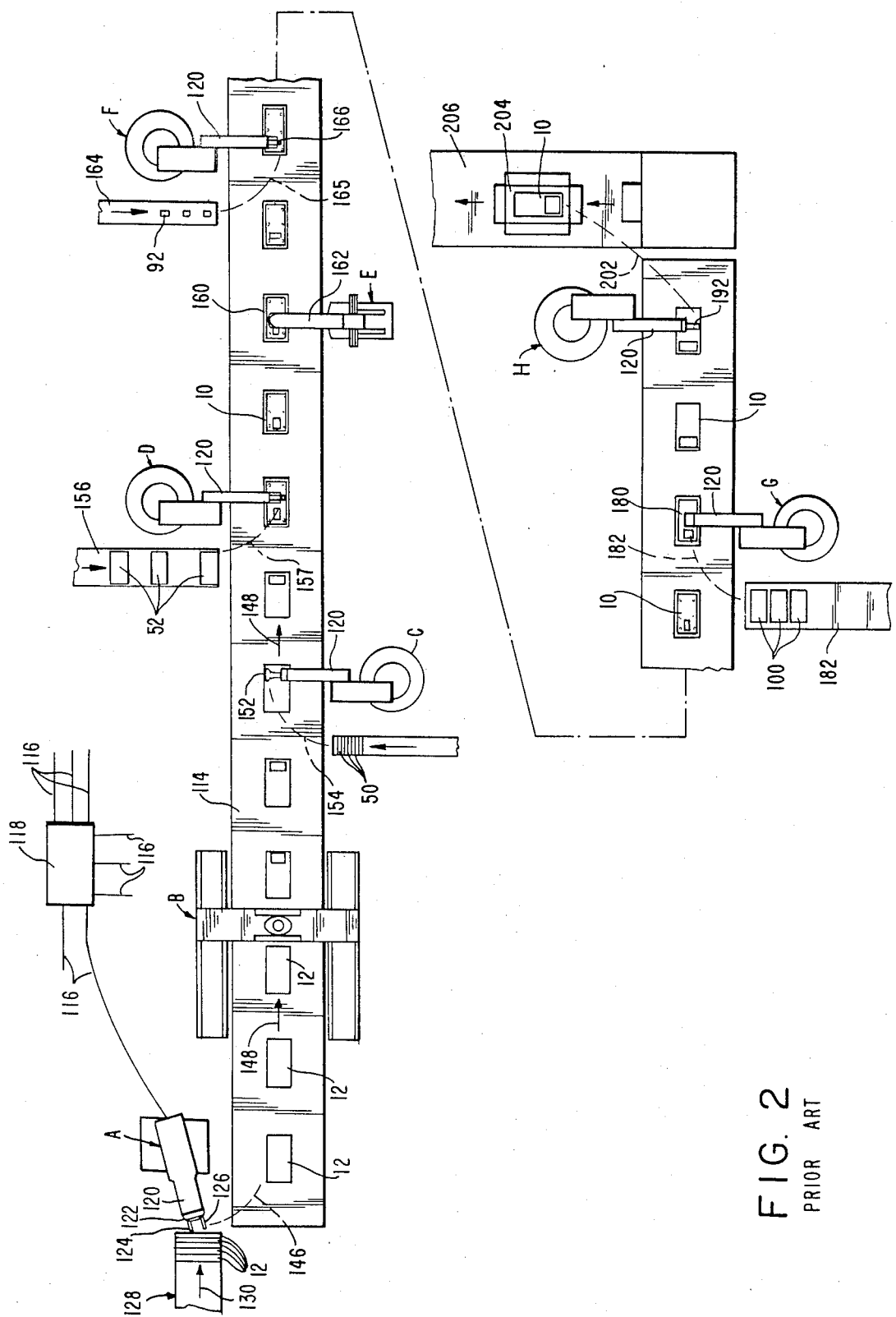
FIG. 2 is a pictorial top view representation of a typical, prior art automatic production line requiring a plurality of robots to perform the eight (8) operational steps required to assemble the article shown in FIG. 1.
Figure 3:
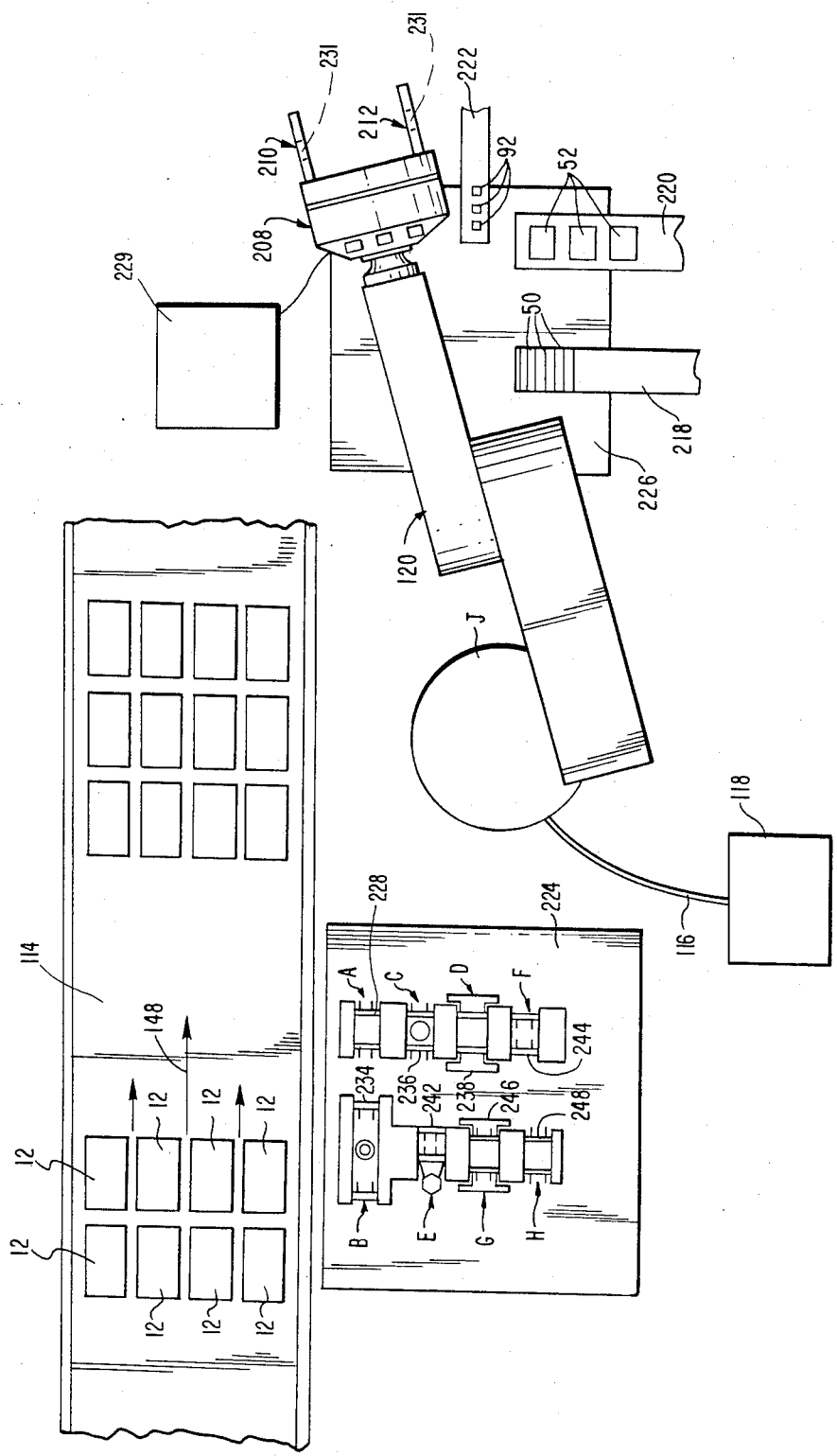
FIG. 3 is a pictorial top plan view representation of an adaptable, programmable production system utilizing a single robot having an end effector capable of exchanging tool elements from a passive and non-interactive storage tray without human intervention.

Referring now to the figures, and in particular to FIG. 1, wherein there is shown a typical article 10 which is capable of being assembled by an automatic programmable production system, shown in FIGS. 2 and 3. The article includes, for example, a generally rectangularly-shaped plastic face-plate 12 having a rectangular opening 14 disposed on the upper portion thereof. A plurality of cylindrically-shaped stand-offs 16, 18, 20, 22, 24 and 26 are provided at various points along the internally facing surface 28 of the face-plate 12. The stand-offs are molded as an integral part of the face-plate 12 when the face-plate is manufactured. A pair of hooks or latching protrusions 30 and 32 are also molded on the inner surface 28 of the face-plate 12 during its manufacture. The stand-offs 18, 20, 22, 24, 26 and 28 are provided with centrally disposed blind holes 34, 36, 38, 40, 42 and 44 which were molded in each of the stand-offs during the injection molding of the plastic face-plate 12.

The face-plate opening 14 is provided with an inwardly extending lip portion 46 onto which a seam or bead of adhesive material 48 is applied. A transparent viewing glass or plastic such as Lucite 50 is then positioned over the adhesive 48 and pressed into position against the face-plate lip portion 46.

An electronic circuit board 52 having a plurality of electronic components such as resistors 54, capacitors 56, diodes 58 and a meter 60 may be preassembled on the electronic circuit board 52 from another automatic assembly line not shown. The circuit board may also contain an on-off switch 62 having its slide or toggle portion 64 protrude through an opening 66 provided in the circuit board 52. The circuit board, when assembled to the face-plate 12, will permit the slide portion 64 to extend through an opening provided in the face-plate allowing access thereto from the outer surface thereof.

The circuit board 52 is also provided with a plurality of apertures 68, 70, 72, 74, 76 and 78 which are positioned to align with holes 34, 36, 38, 40, 42 and 44 provided in the plastic face-plate stand-offs 16, 18, 20, 22, 24 and 26, respectively.

A plurality of screws 80, 82, 84, 86, 88 and 90 are inserted through the apertures 68, 70, 72, 74, 76 and 78 and are threaded into the holes 34, 36, 38, 40, 42 and 44 thereby retaining the electronic circuit board 52 within the face-plate 12.

The electronic circuit board 52 is also provided with a rectangularly-shaped aperture through which a typical battery clip 92 may be inserted. The battery clip 92 is provided with a pair of elongated apertures 94 and 96 which is adapted to cooperate with the latching protrusions 30 and 32, respectively, when the battery clip 92 is of a proper shape, generally as shown, and is adapted to receive a typical nine (9) volt battery which has its wire terminals 98 connected to the printed circuit wiring 93 provided on the electronic circuit board 52.

A plastic snap-on back-plate 100 is provided with a shoulder portion 102 which cooperates with the internal surface of the vertically positioned walls 104 of the face-plate 12, so that once inserted it remains in position by friction forces. The plastic snap-on back-plate 100 may also be provided with outwardly extending protrusions 106, 108, 110 and 112 that function as feet and are molded into the back-plate when the back-plate is manufactured, or alternatively, the feet may be made of rubber button inserts received into apertures provided in the back-plate 100. Thus, we have an assembly which is to be completed on an automatic production line without human hands.

Referring now to FIG. 2, which discloses how each of the eight steps required to complete the assembly would be completed with present day automatic assembly lines or production systems. The view shown in FIG. 2 is a top plan view showing the location of different automatic robots having robotic arms and various types of end effectors to accomplish each of the eight steps required to assemble the article disclosed in FIG. 1. Further, in the description, let us assume that the production line includes a movable belt or platform 114 upon which the article being manufactured is assembled. Each of the dedicated robots designated by the letters A through H are automatically controlled by information being fed to them, via electrical control cables 116, emanating from the central master computer 118. Each of the dedicated robots A through H includes its own electronic circuitry within its housing to interpret the information being coupled to it, via cables 116, connected to the master computer 118.

Figure 2A:
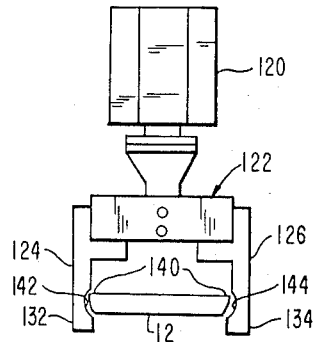
FIGS. 2A through 2H are pictorial representations in elevation of various dedicated robot end effectors which provide each of the individual functions required in assembling the article disclosed in FIG. 1.
Figure 2B:
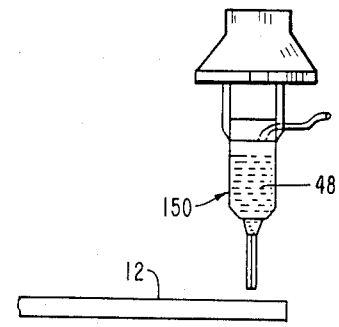

The robot A has a robotic arm 120 with an end effector 122 disposed at the distal end thereof. The end effector 122 is provided with gripper fingers 124 and 126 which are adapted to receive therebetween a single face-plate 12 a plurality of which are stacked in a feed mechanism 128 designed to move the face-plate 12, in an upright position, in the direction of arrow 130. The end effector 122, is of conventional design, and is capable of moving the distal ends 132 and 134 of gripper fingers 124 and 126 in the direction of arrows 136 and 138 (shown in FIG. 2A) in response to electrical information received from the master computer 118. The gripper fingers are capable of engaging a single face-plate between its fingers which are designed to cooperate with the side walls 140 of the face-plate 12 by cooperating grooves or channels 142 and 144 provided in the gripper fingers 126 and 128, respectfully. The robotic arm 120 rotates in an arc as shown by the dotted line 146 until the face-plate 12 is in position on the moving belt 114. After releasing a face-plate, it returns to engage a second face-plate 12, repeatedly placing it upon the moving belt at predetermined intervals. The face-plate 12 moves in the direction of arrow 148 until it is in the vicinity of robot B, which is shown in elevation in FIG. 2B. Robot B engages the protruding lip portion 46 of face-plate 12 and with the aid of a pressured adhesive gun applies the adhesive 48 as required. The gun 150 moves alongside the moving belt 114 and is synchronized therewith in order to provide the adhesive at the proper location in the required amount.

Figure 2C:
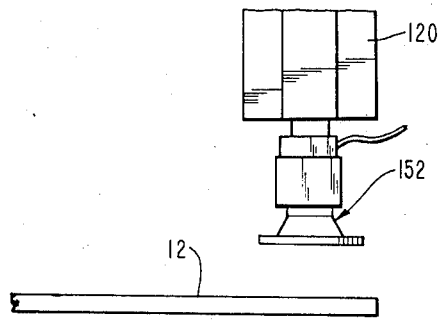

The face-plate moves along with the belt 114 until it reaches robot C which is provided with a robotic arm 120 and a vacuum end effector 152. End effector 152 is of the vacuum type and the robotic arm 120 is programmed to rotate in an arc 154 until the vacuum end effector 152 comes into contact with a magazine in which a glass or plastic face-plate 50 is positioned. The vacuum end effector 152 retains the glass or plastic upon activation of the vacuum and places it over the adhesive 48 disposed on the lip portion 46 of face-plate 12, applying a slight pressure to insure correct positioning and adherence thereto. An elevational view of the vacuum pick-up is shown in FIG. 2C.

Figure 2D:
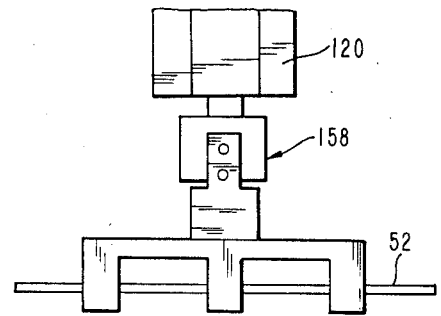
Figure 2E:
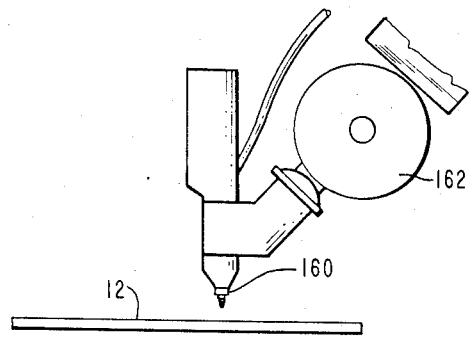

The assembly continues moving towards robot D, which is designed with the aid of its robotic arm 120 to engage the electronic printed circuit board 52 brought into position proximate robot D by a moving belt or platform 156. The electronic printed circuit board 52 is engaged by the end effector 158 disposed on the distal end of robotic arm 120 (shown in elevation of FIG. 2D) and moves in an arc 157 to place it in position on the face-plate 12, as shown in FIG. 1. The article being assembled continues moving along belt 114 until it reaches robot E wherein, with the aid of an automatic screw driver 160 and a screw feed mechanism 162, the screws 80, 82, 84, 86, 88 and 90 are inserted into holes 34, 36, 38, 40, 42 and 44, respectively.

Figure 2F:
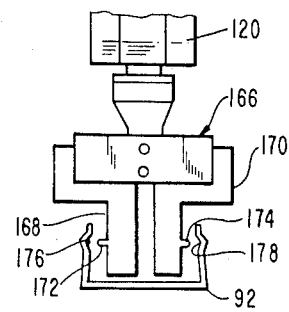

The battery clip 92 is brought into position proximate robot F by means of a moving belt 164. Robotic arm 120 of robot F utilizes its end effector 166, which is provided with gripper fingers 168 and 170 that have externally extending protrusions 172 and 174 designed to cooperate with grooves 176 and 178, respectively, provided on battery clip 92. The end effector 166 is capable of moving the gripper fingers 168 and 170 to properly engage grooves 176 and 178 on the battery clip 92 lifting it from a moving belt 182. The robotic arm then rotates in an arc 165 to place the battery clip 92 in position in the aperture provided in the electronic circuit board 52. Sufficient pressure is applied to have the battery clip engage and be retained by latching protrusions 30 and 32. The end effector 166 is shown in elevation in FIG. 2F.

The article 10 continues moving along with the belt 114 until it approaches robot G, which has a robotic arm 120 and an end effector 180 that is capable of moving in an arc 182 until it comes into position to engage back-plate 100 brought into its retrieval position by means of a moving belt 182. End effector 180 (shown in elevation in FIG. 2G) is provided with a pair of gripper fingers 184 and 186 which are provided with grooves 188 and 190, respectively, designed to engage and conform with the back-plate 100. End effector 180 is capable of moving to engage the back-plate and by rotating through an arc 182 places the back-plate 190 onto the face-plate 12 thereby completing the assembled item as it moves along belt 114.

Figure 2G:
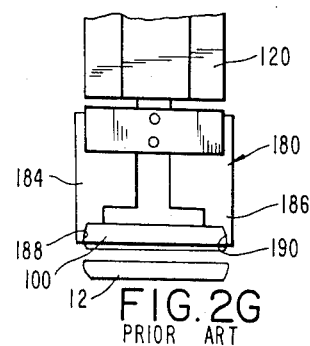
Figure 2H:
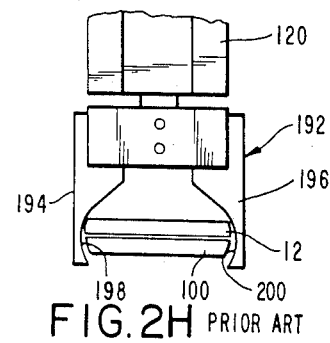

The fully assembled article 10 approaches robot H, which is provided with a robotic arm 120 having an end effector 192 disposed on the distal end thereof. The end effector is provided with gripper fingers 194 and 196 which are provided with grooves 198 and 200, respectively, that conform to the outer surface configuration of face-plate 12 and back-plate 100 in a completed assembly. Robot H rotates in an arc 202 after engaging the article 10 and deposits it into a shipping carton arriving at the proper position on a movable belt 206 which is part of an auxiliary package system, not shown and described herein. An elevational view of end effector 192 is shown in FIG. 2H and an elevational view of end effector 180 is shown in FIG. 2G.

Referring now to FIG. 3, which shows a plan view of a simplified adaptable, programmable production system, according to the principals of the present invention. The face-plates 12 are placed on a moving belt or platform 115 in parallel columns. The robot J includes a robotic arm 120 having disposed thereon at its distal end an end effector 208. The end effector 208 is provided with a pair of gripper fingers 210 and 212. The gripper fingers 210 and 212 are capable of inward and outward movement as shown in FIGS. 3A through 3H in the direction of arrows 214 and 216 and each finger includes therein a locking mechanism such as a controlled release valve 231. End effector 208 is the only end effector that is utilized to perform the eight functions required in the assembly of the article 10. The plastic face-plate 12, as well as, the rear back-plate 100 may be placed upon the moving belt 114, or, alternatively, the back-plate 100 may be fed into position near the robotic arm 120, via a moving belt, not shown, disposed proximate the other moving feed belts 218, 220 and 222.

The gripper fingers 210 and 212 of the end effector 208 are provided with a fluid control release valve 231, (FIG. 3) disposed in each of the gripper fingers 210 and 212. This release mechanism 231 is suitable for engaging (locking) and disengaging (releasing) a variety of tools such as those shown at positions A through H in the passive and non-intereactive gripper tool crib 224 or components disposed on moving belts 218, 220 and 222. The terms "passive and non-interactive" as applied herein, when referring to the gripper tool crib 224, is defined to mean a tool location mechanism that has specific coordinates (predetermined locations for each tool) known by the computer 118 and performs no other function. Each tool A through H, is placed in a predetermined position and may be retrieved by the end effector 208 upon receiving signals from either the main computer 118, via cable 116, or an auxiliary microcomputer placed into the end effector 208 itself. A more detailed description of the end effector 208, its construction, operation and internal parts is disclosed in U.S. Pat. No. 4,591,198 issued to Mathew L. Monforte on May 27, 1986, and a detailed description of typical tools and their construction is disclosed in U.S. patent application Ser. No. 061,813 filed June 4, 1987 by the same inventor are incorporated herein in their entirety.

Robotic arm 120 is capable of moving (rotating) from the passive non-interactive gripper tool crib 224 to the passive material pick-up station 226 and is capable of reaching any of the positions on the moving belt 114 when in line with the robot J. In order to perform the first operation, which is placing the face-plate 12 on the belt 114, tool A is utilized. The tool crib 224 and material pick-up station 226 are passive and non-interactive. They are used to accurately locate the end effector tools and components and offer no resisting, reacting or retaining forces to the tools and components disposed therein. A tool is retained on the end effector 208 by computer activation of the locking mechanism 231 or a component may be retained between the end effector fingers 210 and 212 by the computer signals that control the movement of the end effector gripper fingers 210 and 212. The robotic arm rotates to position A in tool crib 224, upon receiving the proper command signals from the master computer 118. The gripper fingers are positioned directly over tool 228 disposed in position A in the tool crib. The gripper fingers 210 and 212 engage the outwardly extending pins provided on the outside surface of the external pick-up tool 228 and by another computer command apply pressurized fluid from reservoir 229 to the valve mechanism 231 disposed in the end effector fingers, seats the tool retaining (locking) t to the gripper fingers. The tool 228 is provided with grooves 230 and 232 provided proximate the edges thereof that are adapted to cooperate with and engage the outside walls of face-plate 12. Once the tool has been retained in the gripper fingers they may be used to retrieve a face-plate 12 and place it in position on the moving belt 114. Once the face-plate is in position it may be instructed by a signal from the main computer to release the face-plate and recover another one placing it in the next position. This is repeated until a plurality of face-plates are in position on the moving belt.

The robotic arm then is rotated to the passive non-interactive gripper tool crib 224 to return tool 228 by releasing the valve mechanism 231 on computer command wherein thereafter it moves to location B in tool crib 224 and engages tool 234. Tool 234 includes the same affixing mechanism as tool 228 except that the engaging pins are inwardly extending and the base-plate of the tool includes a device for dispensing adhesive in the location prescribed by the main frame computer instructions. Tool 234 dispenses adhesive upon all of the inwardly extending lips 46 provided on the face-plates 12. When completed the robotic arm rotates back to the passive gripper tool crib 224, returns tool 234 to position B and moves to position C where it engages tool 236.

Tool 236 includes outwardly extending engaging pins as does tool 232 and is provided wit a vacuum system disposed on the outwardly facing bottom surface thereof. Tool 236 is capable of engaging and retaining the glass plate 50 from the conveyor belt 218 and placing it in each of the face-plates 12 in the proper location.

Figure 3A:
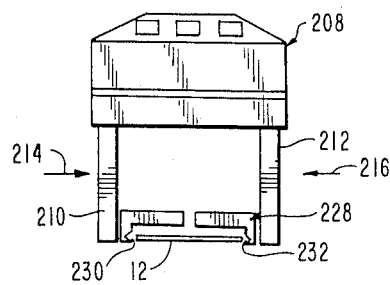
FIGS. 3A through 3H are pictorial representations in elevation of various tool elements that are automatically exchangeable in the instant end effector and which will cooperate with the end effector and robotic arm of the instant invention to perform the same eight (8) operational steps shown in FIG. 2.
Figure 3B:
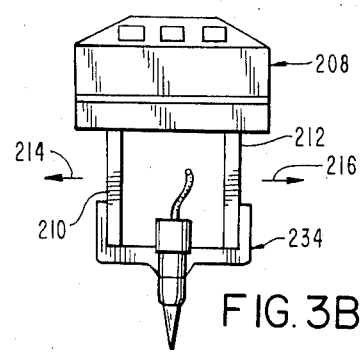
Figure 3C:
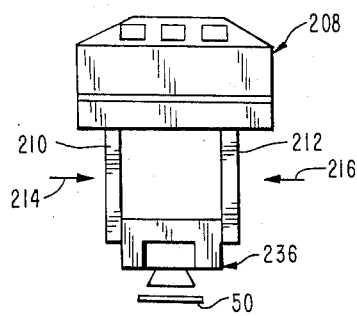
Figure 3D:
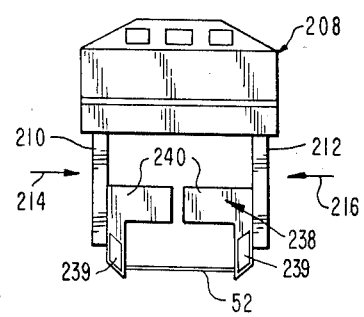
Figure 3E:
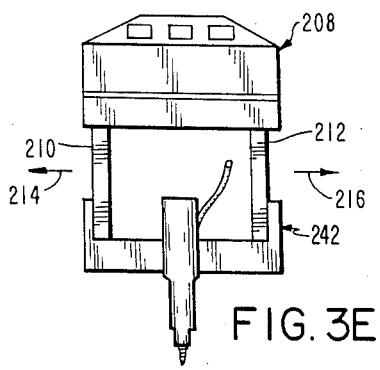

A view in elevation of tools 228, 234 and 236 may be found in FIGS. 3A, 3B and 3C, respectively.

When all the face-plates are in position the end effector 208 is rotated to the tool crib 224 again and returns tool 236 to its proper position (C). End effector 208 will then engage tool 238 which is also provided with externally extending pins so that it may be retained in gripper fingers 210 and 212, as described earlier. Tool 238 may be provided with optical prisms 239 disposed in and focused through the distal ends of tool 238 which cooperates with sensors, (not shown), disposed in the gripper fingers to provide an electrical signal if the tool is unable to engage the electronic circuit 52 board as required. In addition, a safety lock may be provided in tool 238 at the rear portion 240 thereof to prevent excessive pressure being applied to the printed circuit board. Here again the robotic arm is rotated into position and inserts the printed circuit board 52 in each of the faceplates 12 as required and then returns to the tool crib 224 upon command of the master computer 118, releasing its tool and then moves to position E to engage tool 242.

Tool 242 is provided with inwardly extending pins or protrusions and is engaged by the gripper fingers 210 and 212 as explained hereinbefore. Tool 242 is shown in elevation in FIG. 3E and includes an automatic screwdriver and screw-inserter mechanism wherein the robotic arm proceeds to install screws into their proper positions in the printed circuit board as explained earlier. When all the screws are inserted the robotic arm again returns to the tool crib and returns tool 242 to its proper position (E) and moves to position F where it engages tool 244 on gripper fingers 210 and 212 by means of the inwardly extending pins provided thereon.

Figure 3F:
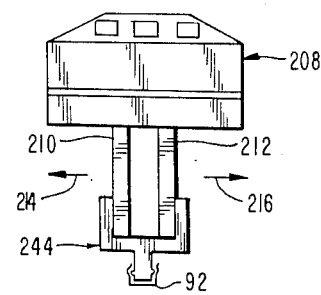
Figure 3G:
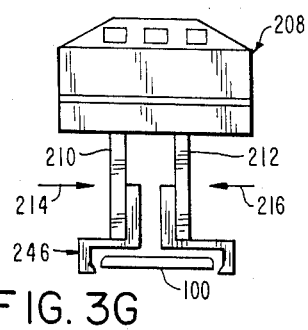
Figure 3H:
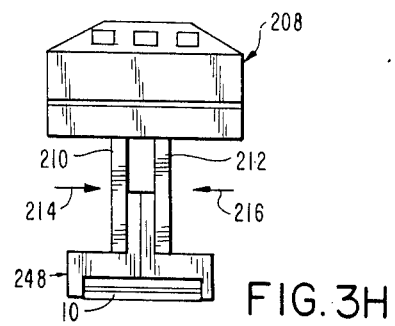

Tool 244 is shown in elevation in FIG. 3F and is caused to be engaged with gripper fingers 210 and 212 by means of inwardly (internally) extending pins provided therefor. Once the robotic arm inserts the battery clips 92 into the printed circuit board it remains engaged by virtue of the apertures provided in the battery clip cooperating with latching protrusions 30 and 32. The lower extending portion of tool 244 is provided with an outwardly extending protrusion to properly engage the grooves provided on the battery clip 92. Once again the tool 244 is returned to its position (F) and is released by the end effector 208, which moves to position G to acquire tool 246 that is coupled to the gripper fingers 210 and 212 by means of outwardly extending pins provided thereon.

The outwardly extending portions of tool 246 are provided with curved grooves designed to engage and cooperate with back-plate 100 so that it may be readily moved from one position to another. The back-plate 100 is placed on the front-plate 12 by the robotic arm 120 thereby completing the assembly of article 10.

Once assembled the robotic arm returns tool 246 to its proper position (G) in the tool crib 224 and engages tool 248 by the external pins provided thereon. Tools 244, 246 and 248 are shown in elevation in FIGS. 3F, 3G and 3H, respectively. Tool 248 is provided with a channel at the distal ends thereof, that is designed to cooperate with the shape of the face-plate 12 and back-plate 100, when assembled, so that it may move as a complete assembly from the moving belt 114 into the shipping carton in a manner similar to that utilized in the conventional system.

Once all the articles are assembled, tool 248 is returned to its proper position (H), and the production of a new article may be started again. If the batch of articles is to remain the same then this cycle can be repeated as many times as is necessary. If the production line is to assemble a new batch of articles it is only necessary for a human to change the tool crib and items being fed to the component feeding area, as well as, the computer program and the production line is ready to start assembling again. It is not necessary, as would be in the conventional type automatic production line, to shut down the system until each of the tools can be changed in each of the robots. In some cases, the robot itself, has to be changed because it is not capable of performing the required function. The programming for the robots would also have to be changed in the prior art production systems when a new batch of items are manufactured. It should be obvious to those consulting U.S. Pat. No. 4,591,198 that the end effector gripping fingers may be utilized without the use of an end effector tool to pick-up, retain and insert components into a printed circuit board, as long as the shape of the component is such that it may be readily received by the end effector gripper fingers.

A complete disclosure of the electronics utilized in the master control computer is beyond the scope of this patent. However, a robotic arm suitable for use with end effector 208 is commercially available from Unimation, Incorporated (a division of Westinghouse), Shelter Rock Lane, Danbury, Conn.

Hereinbefore has been disclosed an adaptable, programmable production system simplifying the production techniques utilized in automatic production lines wherein a single robot having at least one robotic arm is provided with an end effector on its distal end with a gripper device capable of exchanging its own tools in order to perform multiple assembly functions. It will be understood that various changes in the details, materials, arrangement of parts and operating conditions which have been herein described and illustrated in order to explain the nature of the invention may be made by those skilled in the art within the principles and scope of the present invention.

Having thus set forth the nature of the invention what is claimed is:

1. An adaptable, programmable production system for manufacturing articles requiring a plurality of operations, comprising, in combination:
   (a) electronically programmable robot means having one controllable arm, said robot means being disposed proximate a surface utilized for the assembly of said articles;
   (b) end effector means, disposed upon the distal end of said arm having movable gripper means, said gripper means including a pair of moving fingers having a locking mechanism disposed therein with a first or locking position and a second or releasing position, said gripper means fingers automatically exchanging and replacing end effector tools and components in response to a prescribed program coupled to said robot means, said gripper means fingers receiving, locking and releasing a plurality of end effector tools and components;
   (c) storage means for positioning said plurality of tools and components to be installed on said article being manufactured, said storage means being passive and non-interactive, solely providing a predetermined location for said tools and components and disposed proximate said robot means within the reach of said arm;
   said arm moving said end effector means to said storage means for selecting a component, a tool and thereafter a component and installing said component in said article being manufactured and selecting another tool for performing a plurality of pre-programmed operations on said article; and
   (d) means for supplying programmed information for performing said operations to said robot means.

2. An adaptable, programmable production system according to claim 1, wherein said assembly surface comprises a moving belt conveyor.

3. An adaptable, programmable production system according to claim 1, wherein said end effector tool includes light conductors which continue a light path provided in said end effector means, the interruption of said light path indicating when said end effector acquires a component.

4. An adaptable, programmable production system according to claim 1, wherein said storage means is stationary and non-interactive, solely providing a predetermined location and said end effector moves towards and selects an end effector tool from said storage means.

5. An adaptable, programmable production system according to claim 1, wherein each said end effector tool is of a different size and shape and is made to perform a different function.

6. A method of providing an adaptable programmable production system for manufacturing articles requiring a plurality of operations comprising the steps of:

(a) providing an electronically programmable robot means having at least one control arm with an end effector having gripper means disposed on the distal end thereof, said gripper means including a pair of moving fingers having a locking mechanism disposed therein with a first or locking position and a second or releasing position;

(b) providing a surface proximate said robot for the assembly of an article to be manufactured;

(c) providing a storage means, said storage means being non-interactive, solely having a specific predetermined location for a plurality of tools and components to be installed in said article;

(d) programming said robot arm means to cause said gripper means fingers to select a tool means by having said gripper means fingers engage said tool means and said locking mechanism move to said first or locking position responsive to a robotic command, said tool means being adapted to cooperate with a component from said storage means.

* * * * *